United States Patent
Leobandung

(10) Patent No.: US 11,243,063 B2
(45) Date of Patent: Feb. 8, 2022

(54) ELECTRICAL MEASURABLE OVERLAY STRUCTURE

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 253 days.

(21) Appl. No.: 16/597,357

(22) Filed: Oct. 9, 2019

(65) Prior Publication Data

US 2021/0108908 A1    Apr. 15, 2021

(51) Int. Cl.
*G01B 7/14*    (2006.01)
*H01L 23/00*   (2006.01)
*H03K 3/037*   (2006.01)

(52) U.S. Cl.
CPC .............. *G01B 7/14* (2013.01); *H01L 23/573* (2013.01); *H03K 3/037* (2013.01)

(58) Field of Classification Search
CPC ......... G01B 7/14; H01L 23/573; H01L 22/14; H03K 3/037; G03F 7/70633
See application file for complete search history.

(56) References Cited

U.S. PATENT DOCUMENTS

| | | | |
|---|---|---|---|
| 4,437,760 A | 3/1984 | Ausschnitt | |
| 4,476,155 A * | 10/1984 | Niemi | H01B 3/46 427/58 |
| 5,617,340 A | 4/1997 | Cresswell et al. | |
| 5,699,282 A * | 12/1997 | Allen | G01R 31/2818 324/699 |
| 6,323,097 B1 * | 11/2001 | Wu | G01B 7/003 438/107 |
| 6,380,554 B1 | 4/2002 | Bush et al. | |
| 6,436,726 B2 | 8/2002 | Look et al. | |
| 9,007,571 B2 | 4/2015 | Tzai et al. | |
| 2005/0134867 A1 * | 6/2005 | Shin | G03F 7/70616 356/623 |
| 2006/0109464 A1 | 5/2006 | Minami | |
| 2014/0132283 A1 * | 5/2014 | Huang | G03F 1/42 324/658 |

(Continued)

FOREIGN PATENT DOCUMENTS

KR    100587638 B1    5/2006
KR    20100117799 A   11/2010

OTHER PUBLICATIONS

J. M. Dikeman and K. P. Roenker, "Nonuniformity-induced error in mask misregistration test structures," in IEEE Transactions on Electron Devices, vol. 35, No. 12, pp. 2419-2422, Dec. 1988 (Year: 1988).*

(Continued)

*Primary Examiner* — Daniel R Miller
(74) *Attorney, Agent, or Firm* — Alexander G. Jochym

(57) ABSTRACT

The wafer comprises a first line in a first layer of the wafer. The first line has a first terminal connected to the first line. The wafer comprises a second line in the first layer of the wafer. The second line has a second terminal connected to the second line. The second terminal has a probe connected to apply a voltage ramp. The wafer comprises a third line in the first layer of the wafer. The third line has a terminal connected to the third line.

14 Claims, 8 Drawing Sheets

(56) References Cited

U.S. PATENT DOCUMENTS

2016/0291084 A1\* 10/2016 Chen ................ H01L 23/5226
2017/0167992 A1\* 6/2017 Halder ................ G01B 15/04

OTHER PUBLICATIONS

"Electrical KERF Measurement to Identify Substrate Slip During Semiconductor Wafer Processing", Disclosed Anonymously, IP.com No. IPCOM000239621D, IP.com Electronic Publication Date: Nov. 19, 2014, 6 pages.

"In-Line Electrical Characterization of Metal/via Offset using Diagnostic Structures", Disclosed Anonymously, IP.com No. IPCOM000240524D, IP.com Electronic Publication Date: Feb. 5, 2015, 4 pages.

"System and Method for Assessing Global and Local Variations of Contact Alignment on Semiconductor Chips", Disclosed Anonymously, IP.com No. IPCOM000220560D, IP.com Electronic Publication Date: Aug. 6, 2012, 6 pages.

\* cited by examiner

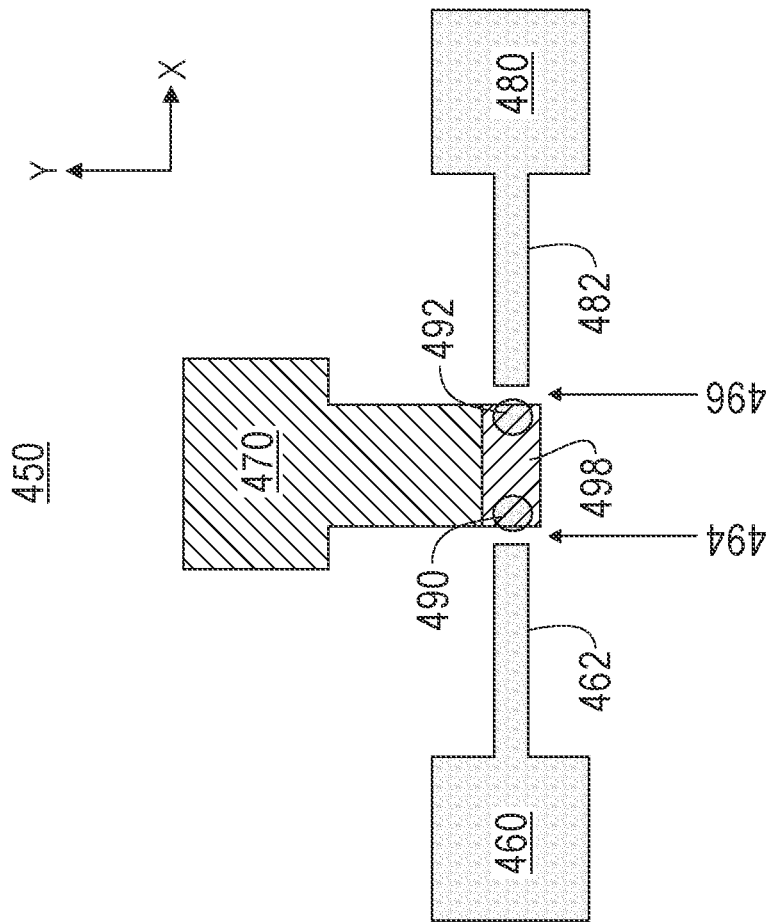
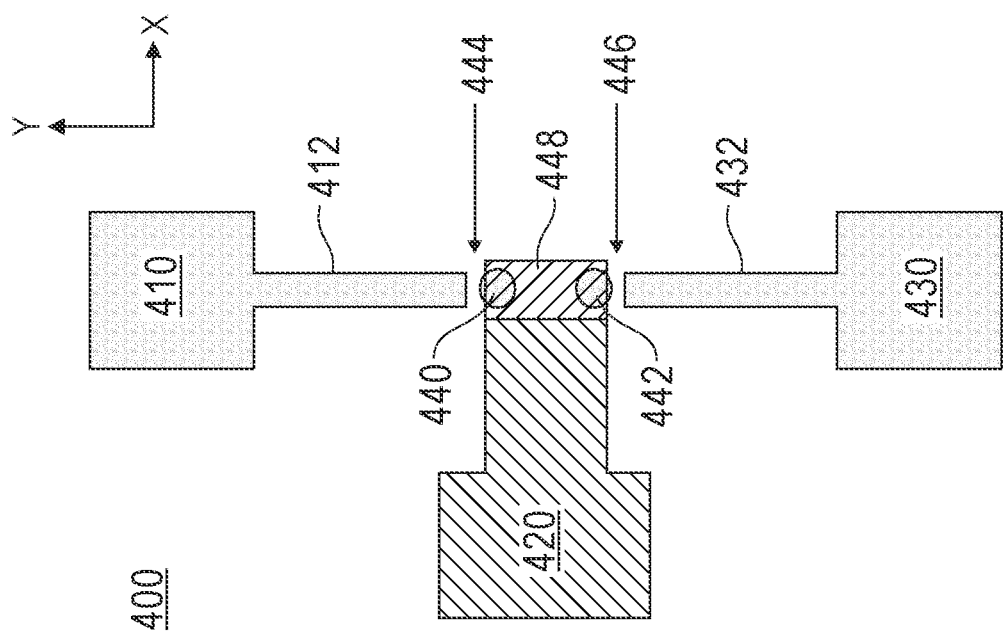
FIG. 4A
FIG. 4B

ELECTRICAL MEASURABLE OVERLAY STRUCTURE

BACKGROUND

The present invention relates generally to the field of silicon wafer manufacturing, and more particularly to electrically measuring overlay on a wafer.

Overlay is positional accuracy that a new lithographic pattern prints on top of an existing lithographic pattern on a wafer. Wafers are manufactured in a sequence of steps, each stage placing a pattern of material on the wafer. Transistors, contacts, etc., are all made of different materials and they are each laid down in an order. In order for the wafer to function correctly, the separate patterns must be aligned correctly so that, for example, contacts, lines and transistors gates lineup.

Overlay control is important in semiconductor manufacturing, and helps to monitor layer-to-layer alignment on multi-layer structures. Misalignment of the layers can cause short circuits and/or connection failures which can lead to reduced fabrication yield and profit margins. As pattern density increases and techniques such as double patterning and 193 nm immersion and Extreme Ultra Violet (EUV) lithography become more common, overlay control becomes even more critical.

SUMMARY

Embodiments of the present invention include a wafer and a method of using the same. The wafer comprises a first line in a first layer of the wafer. The first line has a first terminal connected to the first line. The wafer comprises a second line in the first layer of the wafer. The second line has a second terminal connected to the second line. The second terminal has a probe connected to apply a voltage ramp. The wafer comprises a third line in the first layer of the wafer. The third line has a terminal connected to the third line.

The method of using the wafer includes applying a voltage ramp to a second line in a wafer. The second line is between a first line in the wafer and a third line in the wafer. Whether a first inverter connect to the first line or a second inverter connected to the second line turns on is determined. If the first line is closer to the second line than the second line is to the third line is determined based on which of the first inverter or the second inverter turns on.

The method of using the wafer includes applying voltage to voltage ramp to a second line in a wafer. The second line is between a first line in the wafer and a third line in the wafer. A first current at the first analog digital convertor is measured and a second current at the second analog to digital convertor is measured.

BRIEF DESCRIPTION OF THE DRAWINGS

FIGS. 4A and 4B are a pictorial representation (through a top-view) depicting a structure including a first metal layer and a second metal layer with a pair of vias, in accordance with an embodiment of the present invention.

DETAILED DESCRIPTION

Figure 1B:
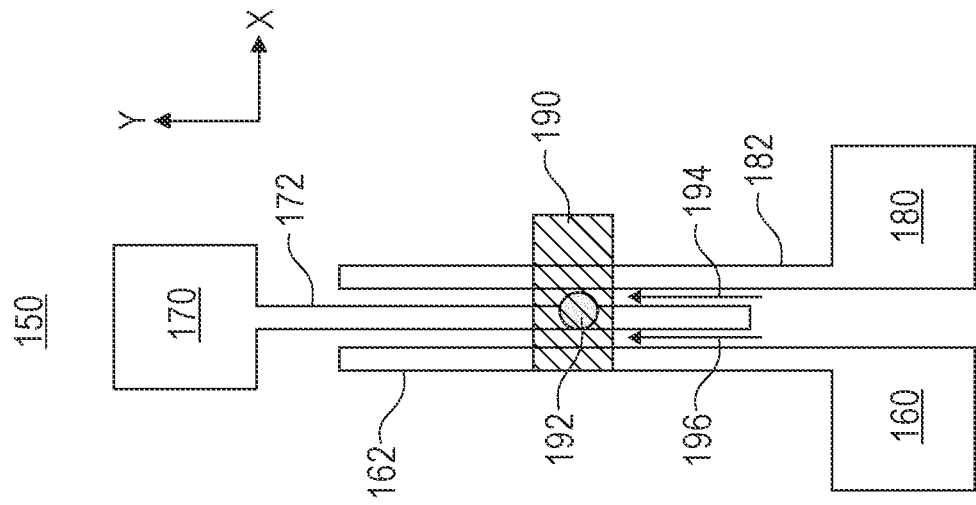
FIGS. 1A and 1B are a pictorial representation (through a top-view) depicting a structure including a second metal layer including a via located atop a first metal layer, in accordance with an embodiment of the present invention.

The overlay between lithographic patterns of a wafer is a unique characteristic that is very hard to be cloned because it is random in nature. Overlay can be used a chip physical unclonable function (PUF), random number generator, and/or chip security. However, overlay is generally measured on a wafer at each level and overlay is very difficult to measure after a chip is complete.

Embodiments of the present invention provide for a structure that can be used to measure the value of overlay, electrically, after the wafer process is complete. Embodiments of the present invention pass the technology ground rules. Structure designed in a technology has to meet specific rules such as distance between metals and via. It is simpler to generate structure to measure overlay electrically that violate technology ground rule. However, such structures usually cannot be in production version of design since it can cause manufacturing issues. Our proposal is to design structure to electrically measure overlay that meet technology ground rules. Embodiments of the present invention provide a structure that can rely on the breakdown of dielectric that is very sensitive to metal spacing to determine distances between layers.

Detailed description of embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

Reference is now made to FIGS. 1A, 1B, 2A, 2B, 3A, 3C, 4A, 4B, 5, and 6, which illustrate a portion of a wafer, in accordance with at least one embodiment of the invention. FIGS. 1A, 1B, 2A, 2B, 3A, 3C, 4A, 4B, 5, and 6, for simplicity purposes, illustrate a number of metal layers and/or lithograph layers that allow for explanation of the invention without being restrictive in the physical layout of the wafer. In an embodiment, the wafer can consist of any number of metal layers, lithograph layers, or any other physical structures known in the art. In an embodiment, the metal layers may consist of any number of lines or vias, gates, epitaxy grown semiconductor, local interconnect, etc. FIGS. 1A, 1B, 2A, 2B, 3A, 3C, 4A, 4B, 5, and 6, include an X and an Y direction in order to describe overlay alignment. In an embodiment, FIGS. 1A, 1B, 2A, 2B, 3A, 3B, 4A, 4B, 5, and 6 include terminals that may be made of the same material as the lines they are connected to or may be made from any conductive material known in the art and not necessarily the same material as the lines. In an embodiment, FIGS. 1A, 1B, 2A, 2B, 3A, 3B, 4A, 4B, 5, and 6 include terminals to only three adjacent lines. In an alternative embodiment, FIGS. 1A, 1B, 2A, 2B, 3A, 3B, 4A, 4B, 5, and 6 include terminals that are connected to each and every line in the wafer. In an embodiment, FIGS. 1A, 1B, 2A, 2B, 3A, 3B, 4A, 4B, 5, and 6 include terminals that are sized depending on the size of the probe to be attached or sized to allow for any other type of connection needed to apply voltage or measure current.

Figure 1A:
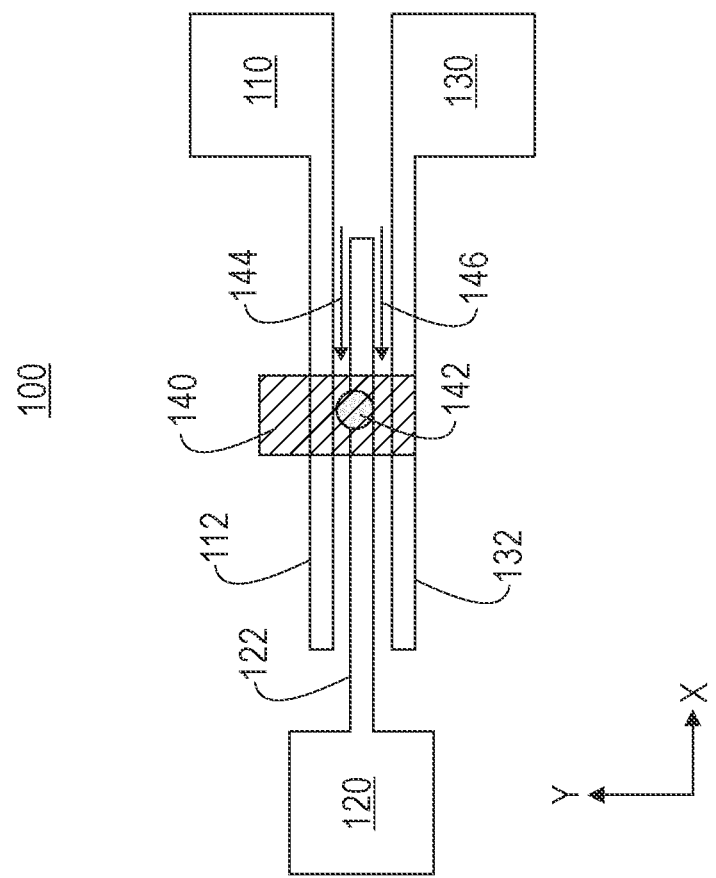

Referring now to various embodiment of the invention in more detail, FIGS. 1A and 1B are a pictorial representation (through a top-view) depicting a structure including a second metal layer including a via located atop a first metal layer, in accordance with an embodiment of the present invention. In an embodiment, each metal layer may be a back end of line (BEOL) or front end of line (FEOL). FIG. 1A is a visual representation of determining overlay in the Y direction. FIG. 1B is a visual representation of determining overlay in the X direction.

In a first embodiment, FIG. 1A depicts a structure 100 on a wafer (not shown) that includes a first metal layer and a second metal layer. In an embodiment, the first metal layer is a conductive layer that has a first patterned layer in the X direction consisting of lines 112, 122, 132. In an embodiment, each line 112, 122, 132 has a conductive terminal 110, 120, 130, respectively, connected to each line. In an embodiment, each line in the wafer has a terminal connected to it. In the first embodiment, FIG. 1A depicts a second metal layer 140 that includes via 142. In the first embodiment, the underlying conductive line 122 is connected to an overlying second metal layer 140 through a connecting "post" filling a through-hole or via 142 formed in the second metal layer 140. In the first embodiment, the layout of FIG. 1A will be used to determine the Y distance between the side of line 112 and via 142, as shown by distance 144 and the X distance between the side of line 132 and via 142, as shown by distance 146.

In a second embodiment, FIG. 1B depicts a structure 150 on a wafer (not shown) that includes a first metal layer and a second metal layer. In an embodiment, the first metal layer is a conductive layer that has a first patterned layer in the Y direction consisting of lines 162, 172, 182. In an embodiment, each line 162, 172, 182 has a conductive terminal 160, 170, 180, respectively, connected to each line. In the second embodiment, FIG. 1B depicts a second metal layer 190 that includes via 192. In the second embodiment, the underlying conductive line 172 is connected to an overlying second metal layer 190 through a connecting "post" filling a through-hole or via 192 formed in the second metal layer 190. In the second embodiment, the layout of FIG. 1B will be used to determine the X distance between the side of line 182 and via 192, as shown by distance 194 and the X distance between the side of line 162 and via 192, as shown by distance 196.

Figure 2B:
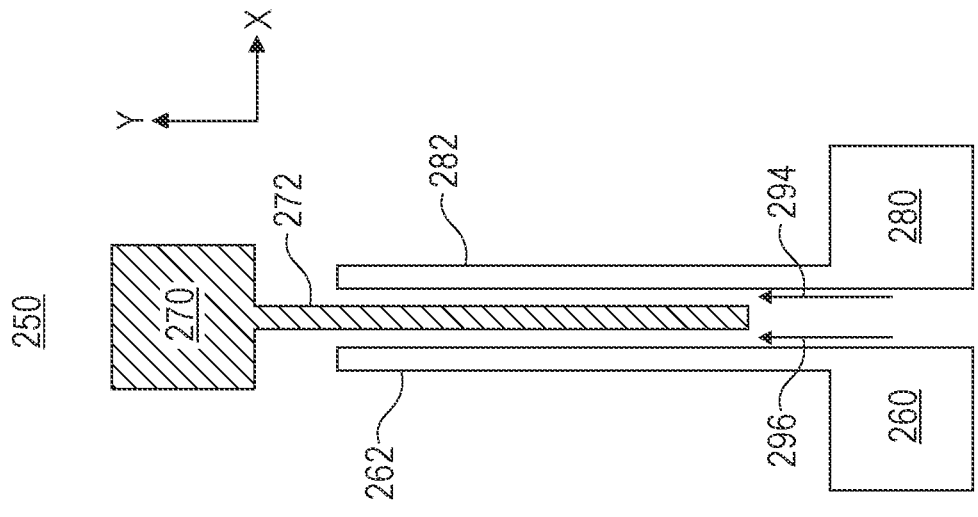
FIGS. 2A and 2B are a pictorial representation (through a top-view) depicting a structure including a first metal layer including a first lithography layer and a second lithography layer, in accordance with an embodiment of the present invention.
Figure 2A:
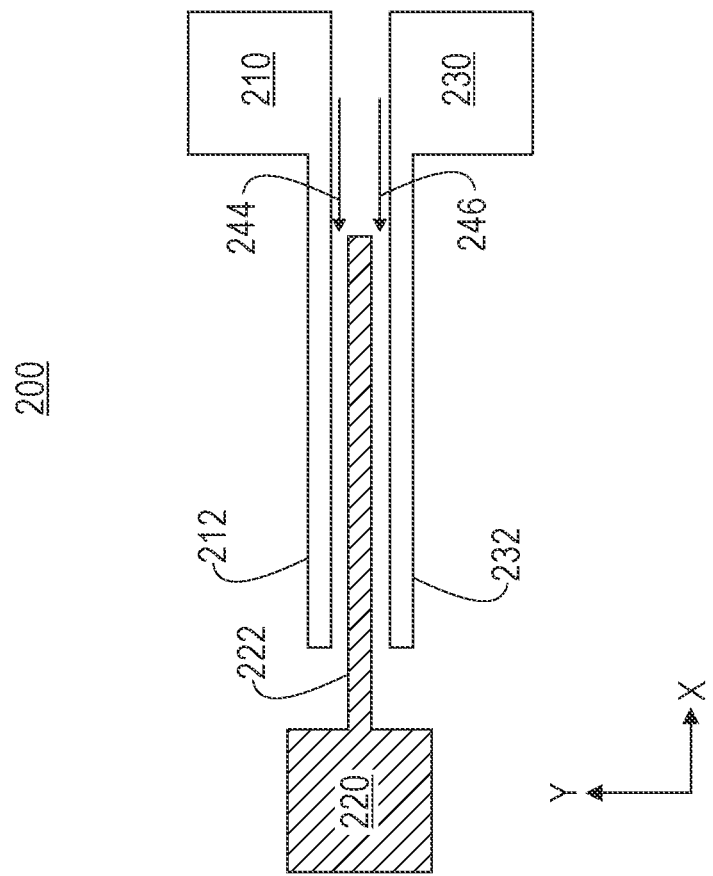

Referring now to various embodiment of the invention in more detail, FIGS. 2A and 2B are a pictorial representation (through a top-view) depicting a structure including a first metal layer including a first lithography layer and a second lithography layer, in accordance with an embodiment of the present invention. In an embodiment, the metal layer may be a back end of line (BEOL) or front end of line (FEOL). FIG. 2A is a visual representation of determining overlay in the Y direction. FIG. 2B is a visual representation of determining overlay in the X direction. FIGS. 2A and 2B depict a structure that is applicable to metals or conductors or via layers that are printed by two or more lithography exposure due to resolution requirements. FIGS. 2A and 2B depict dual lithography metal layers, but, in an embodiment, this structure can be applied to dual lithography via layers structures.

In a third embodiment, FIG. 2A depicts a structure 200 on a wafer (not shown) that includes a first metal layer. In an embodiment, the first metal layer is a conductive layer that has a first patterned layer in the X direction consisting of lines 212 and 232 and a second patterned layer in the X direction consisting of line 222. In an embodiment, each line 212, 222, and 232 has a conductive terminal 210, 220, 230, respectively, connected to each line. In the third embodiment, the layout of FIG. 2A will be used to determine the Y distance between the side of line 212 and the side of line 222, as shown by distance 244 and the Y distance between the side of line 232 and the side of line 222, as shown by distance 246.

In a fourth embodiment, FIG. 2B depicts a structure 250 on a wafer (not shown) that includes a first metal layer. In an embodiment, the first metal layer is a conductive layer that has a first patterned layer in the Y direction consisting of lines 262 and 282 and a second patterned layer in the Y direction consisting of line 272. In an embodiment, each line 262, 272, and 282 has a conductive terminal 260, 270, 280, respectively, connected to each line. In the fourth embodiment, the layout of FIG. 2B will be used to determine the X distance between the side of line 262 and the side of line 272, as shown by distance 296 and the X distance between the side of line 282 and the side of line 272, as shown by distance 294.

Figure 3A:
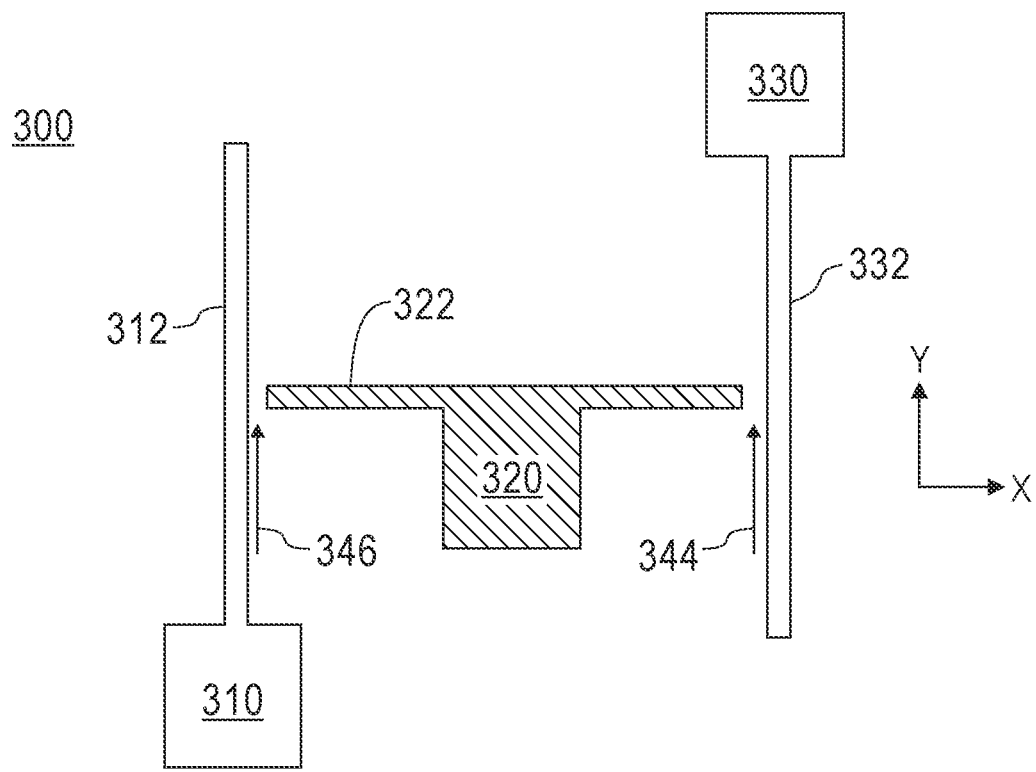
FIGS. 3A and 3B are a pictorial representation (through a top-view) depicting a structure including a first metal layer including a first lithography layer and a second lithography layer, in accordance with an embodiment of the present invention.
Figure 3B:
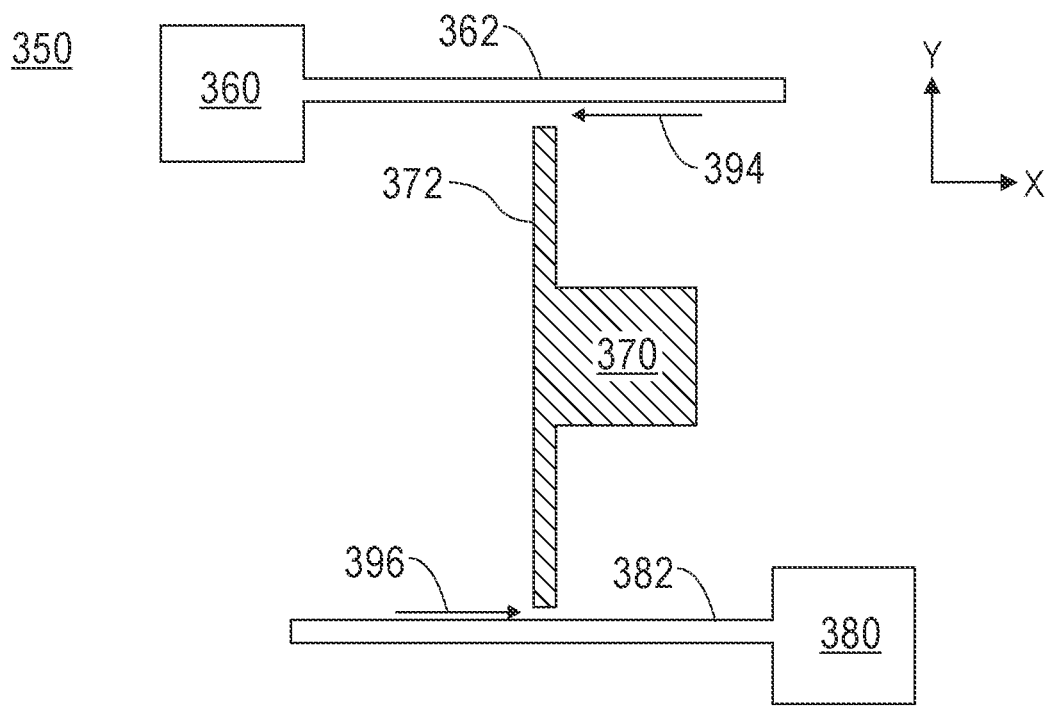

Referring now to various embodiment of the invention in more detail, FIGS. 3A and 3B are a pictorial representation (through a top-view) depicting a structure including a first metal layer including a first lithography layer and a second lithography layer, in accordance with an embodiment of the present invention. In an embodiment, the metal layer may be a back end of line (BEOL) or front end of line (FEOL). FIG. 3A is a visual representation of determining overlay in the Y direction. FIG. 3B is a visual representation of determining overlay in the X direction.

In a fifth embodiment, FIG. 3A depicts a structure 300 on a wafer (not shown) that includes a first metal layer. In an embodiment, the first metal layer is a conductive layer that has a first patterned layer in the X direction consisting of lines 312 and 332 and a second patterned layer in the Y direction consisting of line 322. In an embodiment, each line 312, 322, and 332 has a conductive terminal 310, 320, 330, respectively, connected to each line. In the fifth embodiment, the layout of FIG. 3A will be used to determine the X distance between the side of line 312 and the end of line 322, as shown by distance 346 and the X distance between the side of line 332 and the end of line 322, as shown by distance 344.

In a sixth embodiment, FIG. 3B depicts a structure 350 on a wafer (not shown) that includes a first metal layer. In an embodiment, the first metal layer is a conductive layer that has a first patterned layer in the X direction consisting of lines 362 and 382 and a second patterned layer in the Y direction consisting of line 372. In an embodiment, each line 362, 372, and 382 has a conductive terminal 360, 370, 380, respectively, connected to each line. In the sixth embodiment, the layout of FIG. 5B will be used to determine the Y distance between the side of line 362 and the end of line 372, as shown by distance 394 and the Y distance between the side of line 382 and the end of line 372, as shown by distance 396.

Referring now to various embodiment of the invention in more detail, FIGS. 4A and 4B are a pictorial representation (through a top-view) depicting a structure including a first metal layer and a second metal layer with a pair of vias, in accordance with an embodiment of the present invention. In an embodiment, the metal layer may be a back end of line (BEOL) or front end of line (FEOL). FIG. 4A is a visual representation of determining overlay in the Y direction. FIG. 4B is a visual representation of determining overlay in the X direction.

In a seventh embodiment, FIG. 4A depicts a structure 400 on a wafer (not shown) that includes a first metal layer and a second metal layer. In an embodiment, the first metal layer is a conductive layer that has a first patterned layer in the Y direction consisting of line 412 and line 432. In an embodiment, each line 412, 432 has a conductive terminal 410, 430, respectively, connected to each line. In the seventh embodiment, FIG. 4A depicts a second metal layer 420 that includes vias 440, 442. In the seventh embodiment, the second metal layer 420 is connected to an overlying first metal layer 448 through a connecting "post" filling through-holes or vias 440, 442 formed in the first metal layer 448. In the seventh embodiment, the layout of FIG. 7 will be used to determine the Y distance between the end of line 412 and via 440, as shown by distance 444 and the Y distance between the end of line 432 and via 442, as shown by distance 446.

In an eighth embodiment, FIG. 4B depicts a structure 450 on a wafer (not shown) that includes a first metal layer and a second metal layer. In an embodiment, the first metal layer is a conductive layer that has a first patterned layer in the X direction consisting of line 462 and line 482. In an embodiment, each line 462, 482 has a conductive terminal 460, 480, respectively, connected to each line. In the eighth embodiment, FIG. 4B depicts a second metal layer 470 that includes vias 490, 492. In the eight embodiment, the second metal layer 470 is connected to an overlying first metal layer 498 through a connecting "post" filling through-holes or vias 490, 492 formed in the first metal layer 498. In the eighth embodiment, the layout of FIG. 8 will be used to determine the X distance between the end of line 462 and via 490, as shown by distance 494 and the X distance between the end of line 482 and via 492, as shown by distance 496.

Figure 5:
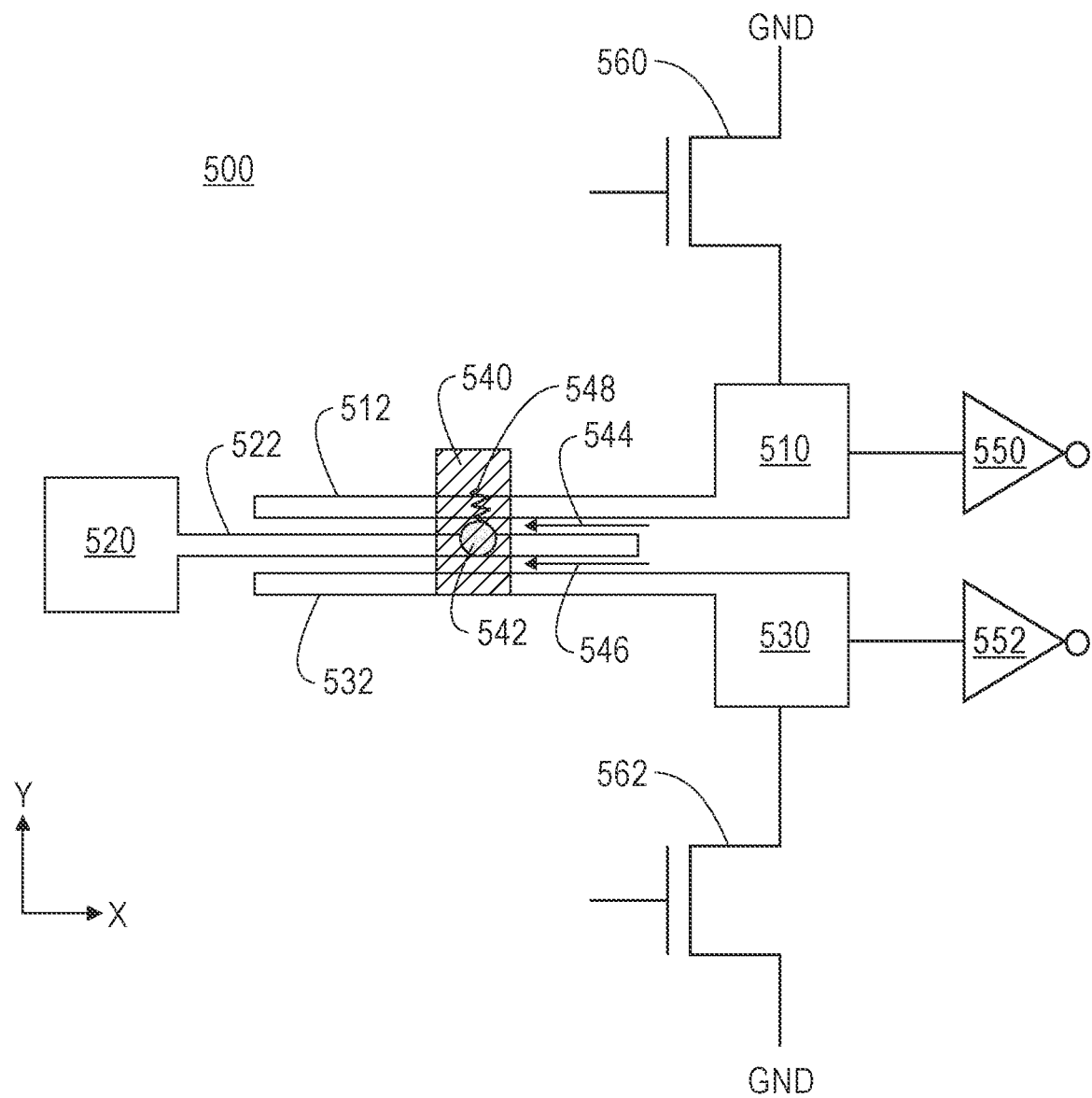
FIG. 5 is a pictorial representation (through a top-view) depicting a structure including a second metal layer including a via located atop a first metal layer with a voltage ramp and an inverter for measuring voltage, in accordance with an embodiment of the present invention.

Referring now to various embodiment of the invention in more detail, FIG. 5 is a pictorial representation (through a top-view) depicting a structure including a second metal layer including a via located atop a first metal layer with a voltage ramp and an inverter for measuring voltage, in accordance with an embodiment of the present invention. The voltage ramp and inverter setup found in FIG. 5 can be used in any of the embodiments displayed in FIGS. 1A, 1B, 2A, 2B, 3A, 3B, 4A, and 4B and is being discussed in a single embodiment for simplicity.

As noted above, FIG. 5 depicts a structure 100 on a wafer (not shown) that includes a first metal layer and a second metal layer, substantially similar to FIG. 1A. In an embodiment, the first metal layer is a conductive layer that has a first patterned layer in the X direction consisting of lines 512, 522, 532. In an embodiment, each line 512, 522, 532 has a conductive terminal 510, 520, 530, respectively, connected to each line. In an embodiment, a voltage ramp is applied to terminal 520 via either a probe from outside a wafer or from some circuit that supply voltage to the terminal. In an embodiment, a first inverter 550 is connected to terminal 510 and a second inverter 552 is connected to terminal 530. In an embodiment, terminal 510 can be connected to ground through gate 560. In an embodiment, terminal 530 can be connected to ground through gate 562. In an embodiment, both wires 512 532, through terminal 510 and 530 and gates 560 and 562 are connected to ground. As the voltage ramp is increased on terminal 520, eventually voltage breakdown will occur between wires that has the shortest distance, either between wires 522 and 512 or between wires 522 and 532, as shown in FIG. 5. In FIG. 5, a smaller distance is depicted between wires 522 and 512 which break down the dielectric as shown by element 548. The wire that shorts will be connected to the line, 512 or 532, that has a smaller distance of distances 544, 546 and therefore is closer in the Y direction to line 522, as discussed below.

Figure 6:
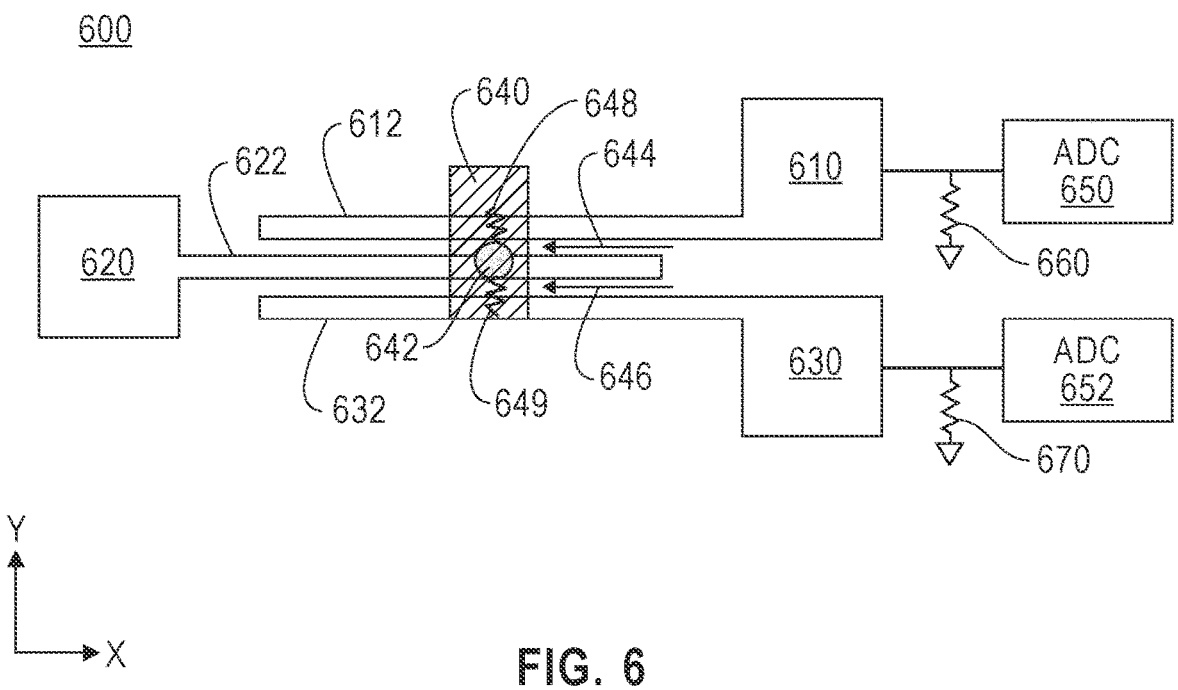
FIG. 6 is a pictorial representation (through a top-view) depicting a structure including a second metal layer including a via located atop a first metal layer with a voltage ramp and an analog to digital converter for measuring current, in accordance with an embodiment of the present invention.

Referring now to various embodiment of the invention in more detail, FIG. 6 is a pictorial representation (through a top-view) depicting a structure including a second metal layer including a via located atop a first metal layer with a voltage ramp and an analog to digital converter for measuring current, in accordance with an embodiment of the present invention. The voltage ramp and analog to digital converter for measuring current setup found in FIG. 6 can be used in any of the embodiments displayed in FIGS. 1A, 1B, 2A, 2B, 3A, 3B, 4A and 4B and is being discussed in a single embodiment for simplicity.

As noted above, FIG. 7 depicts a structure 100 on a wafer (not shown) that includes a first metal layer and a second metal layer, substantially similar to FIG. 1A. In an embodiment, the first metal layer is a conductive layer that has a first patterned layer in the X direction consisting of lines 612, 622, 632. In an embodiment, each line 612, 622, 632 has a conductive terminal 610, 620, 630, respectively, connected to each line. In an embodiment, a voltage ramp is applied to terminal 620 via either a probe from outside a wafer or from some circuit that supply voltage to the terminal. In an embodiment, a first analog to digital converter (ADC) 650 is connected to terminal 610 and a second ADC 652 is connected to terminal 630. As the voltage ramp is increased on terminal 620 electricity is conducted between line 612 and line 622 as shown by element 648, and in between line 632 and 622 as shown by element 649. The voltage ramp is increased to a set voltage. The current going through resistor 660 and resistor 670 will generate analog voltage for the first ADC 650 and second ADC 652 and those voltage will be recorded. This recorded current is used to determine distances 644,646, as discussed below.

Figure 7:
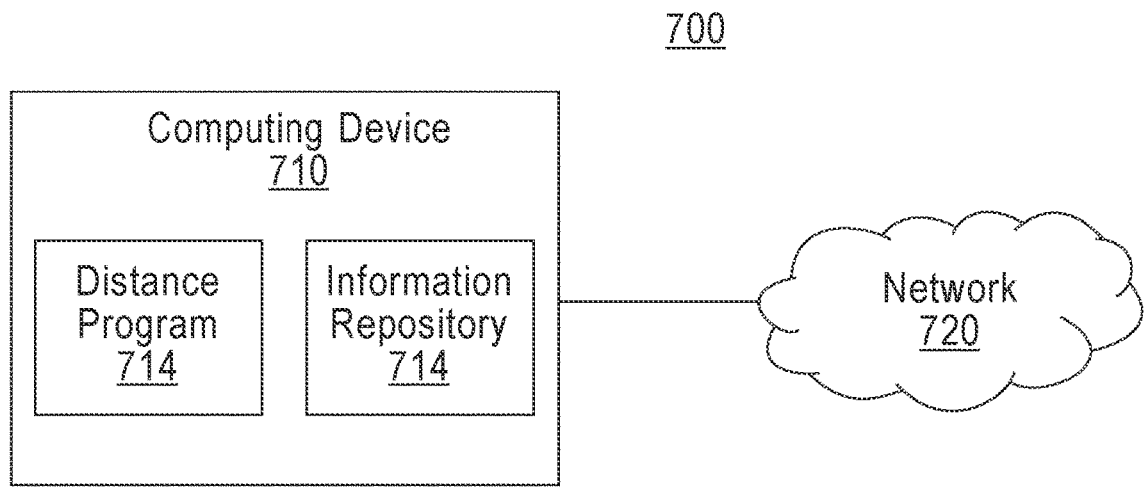
FIG. 7 is a functional block diagram of a network computing environment, generally designated 700, suitable for operation of distance program 712, in accordance with at least one embodiment of the invention.

Referring now to various embodiments of the invention in more detail, FIG. 7 is a functional block diagram of a network computing environment, generally designated 700, suitable for operation of distance program 712 in accordance with at least one embodiment of the invention. FIG. 7 provides only an illustration of one implementation and does not imply any limitation with regard to the environments in which different embodiments may be implemented. Many modifications to the depicted environment may be made by those skilled in the art without departing from the scope of the invention as recited by the claims.

Network computing environment 700 includes computing device 710 interconnected over network 120. In embodiments of the present invention, network 120 can be a telecommunications network, a local area network (LAN), a wide area network (WAN), such as the Internet, or a combination of the three, and can include wired, wireless, or fiber optic connections. Network 120 may include one or more wired and/or wireless networks that are capable of receiving and transmitting data, voice, and/or video signals, including multimedia signals that include voice, data, and video formation. In general, network 120 may be any combination of connections and protocols that will support communications between computing device 710 and other computing devices (not shown) within network computing environment 700.

Computing device 710 is a computing device that can be a laptop computer, tablet computer, netbook computer, personal computer (PC), a desktop computer, a personal digital assistant (PDA), a smartphone, smartwatch, or any programmable electronic device capable of receiving, sending, and processing data. In general, computing device 710 represents any programmable electronic devices or combination of programmable electronic devices capable of executing machine readable program instructions and communicating with other computing devices (not shown) within computing environment 700 via a network, such as network 720. In an embodiment, computing device 710 may include connections for receiving/sending information from an inverter, analog to digital converter, controlling a voltage device, or the like.

In various embodiments of the invention, computing device 710 may be a computing device that can be a standalone device, a management server, a web server, a media server, a mobile computing device, or any other programmable electronic device or computing system capable of receiving, sending, and processing data. In other embodiments, computing device 710 represents a server computing system utilizing multiple computers as a server system, such as in a cloud computing environment. In an embodiment, computing device 710 represents a computing system utilizing clustered computers and components (e.g. database server computers, application server computers, web servers, and media servers) that act as a single pool of seamless resources when accessed within network computing environment 700.

In various embodiments of the invention, computing device 710 includes distance program 712 and information repository 714.

In an embodiment, computing device 710 includes a user interface. A user interface is a program that provides an interface between a user and an application. A user interface refers to the information (such as graphic, text, and sound) a program presents to a user and the control sequences the user employs to control the program. There are many types of user interfaces. In one embodiment, a user interface may be a graphical user interface (GUI). A GUI is a type of user interface that allows users to interact with electronic devices, such as a keyboard and mouse, through graphical icons and visual indicators, such as secondary notations, as opposed to text-based interfaces, typed command labels, or text navigation. In computers, GUIs were introduced in reaction to the perceived steep learning curve of command-line interfaces, which required commands to be typed on the keyboard. The actions in GUIs are often performed through direct manipulation of the graphics elements.

In an embodiment, computing device 710 includes distance program 712. Embodiments of the present invention provide for a distance program 712 that increases voltage on a voltage ramp, determines a short, and then determines which line is closer to the voltage ramp line based on the short. Embodiments for the present invention provide for a distance program 712 that apply a voltage, measure current, and determine a distance based on the measured current.

In an embodiment, computing device 710 includes information repository 714. In an embodiment, information repository 714 may be managed by distance program 712. In an alternative embodiment, information repository 714 may be managed by the operating system of computing device 710, another program (not shown), alone, or together with, distance program 716. Information repository 714 is a data repository that can store, gather, and/or analyze information. In some embodiments, information repository 714 is located externally to computing device 710 and accessed through a communication network, such as network 720. In some embodiments, information repository 714 is stored on computing device 710. In some embodiments, information repository 714 may reside on another computing device (not shown), provided information repository 714 is accessible by computing device 710. Information repository 714 includes, but is not limited to, information about the dielectric properties of insulator between metals, information about known values for conductors in metal properties, and information about known values for insulators in dielectric between the metal.

Information repository 714 may be implemented using any volatile or non-volatile storage media for storing information, as known in the art. For example, information repository 714 may be implemented with a tape library, optical library, one or more independent hard disk drives, multiple hard disk drives in a redundant array of independent disks (RAID), solid-state drives (SSD), or random-access memory (RAM). Similarly, information repository

714 may be implemented with any suitable storage architecture known in the art, such as a relational database, an object-oriented database, or one or more tables.

Figure 8:
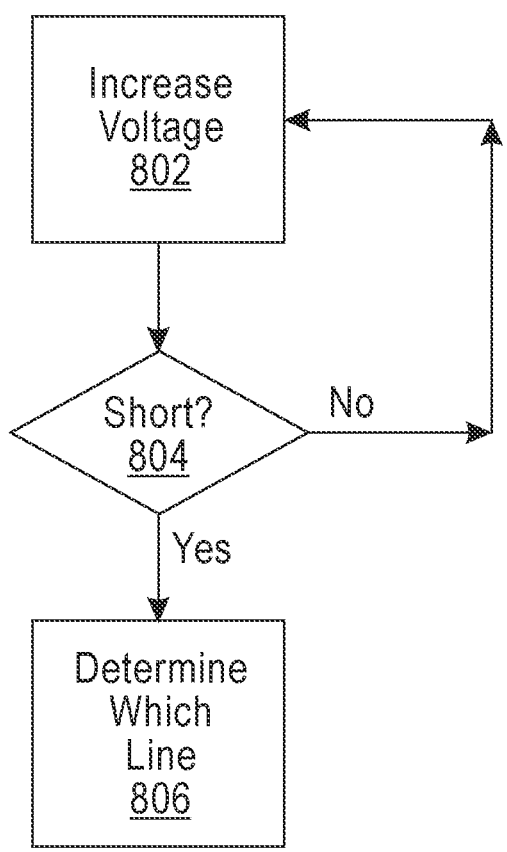
FIG. 8 is a flow chart diagram depicting operational steps for distance program 712, in accordance with at least one embodiment of the invention.

FIG. 8 is a flow chart diagram of workflow 800 depicting operational steps for distance program 712 in accordance with at least one embodiment of the invention. In an alternative embodiment, the steps of workflow 800 may be performed by any other program while working with distance program 712. However, FIG. 8 provides only an illustration of one implementation and does not imply any limitations with regard to the environments in which different embodiments may be implemented. Many modifications to the depicted environment may be made by those skilled in the art without departing from the scope of the invention as recited by the claims. In a preferred embodiment, a user, via a user interface, can invoke workflow 800 upon a user wanting distance program 712 to determine which pair of lines, in a pattern, are closer to another line in between the pair of lines, which pair of lines is closer to a via, or which, of two structures, is closer to a structure located between the two structures. In a preferred embodiment, workflow 800 uses the physical setup shown in FIG. 6.

Distance program 712 increases voltage (step 802). At step 802, distance program 712 increases the voltage at terminal 520 using a probe or circuits that provides a voltage ramp. In an embodiment the voltage starts at 0 and increases to a number input by a user. For example, 0.5 V, 1 V, etc. In an embodiment, by increases the voltage at terminal 520, line 522 also increases voltage. In some embodiments, voltage may be increased automatically by distance program 712 until a short is determined, discussed below.

Distance program 712 determines if there is a short based on amount of current flowing through terminal 510 or 530 (decision step 804). At decision step 804, distance program 712 determines if there is a short in either through terminal 510 or 530. By increasing voltage above 0 volts, current, as shown by element 548, now flows between line 512 and line 522 through via 542. It should be noted, current also flows between line 532 and line 522. If the current passes above a threshold, the wires shorts. In other words, if the current is so large flowing between line 512 and line 522 through via 542 then inverter 550 turn on and output a "0". The opposite is true for the second inverter 552. If distance program 712 determines there is not a short (decision step 804, no branch), distance program 712 proceeds to step 802. If distance program 712 determines there is a short (decision step 804, yes branch), distance program 712 proceeds to step 806.

Distance program 712 determines which line (step 806). At step 808, distance program 712 determines which line 512, 532 is closer to line 522. As shown in FIG. 6, if line 512 is closer to line 522 than line 532 is to line 522, then first inverter 550 will turn on and output a "0". Therefore, distance program 712 can produce an indication of which line is closer, in the Y direction, based on which inverter turn on and output a "0".

Figure 9:
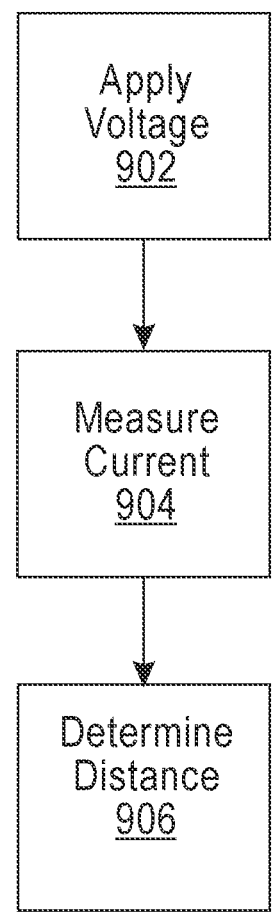
FIG. 9 is a flow chart diagram depicting operational steps for distance program 712, in accordance with at least one embodiment of the invention.

FIG. 9 is a flow chart diagram of workflow 900 depicting operational steps for distance program 712 in accordance with at least one embodiment of the invention. In an alternative embodiment, the steps of workflow 900 may be performed by any other program while working with distance program 712. However, FIG. 9 provides only an illustration of one implementation and does not imply any limitations with regard to the environments in which different embodiments may be implemented. Many modifications to the depicted environment may be made by those skilled in the art without departing from the scope of the invention as recited by the claims. In a preferred embodiment, a user, via a user interface, can invoke workflow 900 upon a user wanting distance program 712 to determine the distance between a pair of lines, lines and a via, or any two structures. In a preferred embodiment, workflow 900 uses the physical setup shown in FIG. 7.

Distance program 712 increases voltage (step 902). At step 902, distance program 712 increases applies a voltage to terminal 620 using a probe. In an embodiment the voltage is set at a certain percentage of the breakdown/short voltage based on expected nominal value of distance between the metal. In an embodiment, by applying voltage at terminal 620, line 622 also increases voltage. In some embodiments, voltage may be increased automatically by distance program 712 until current can be determined, discussed below.

Distance program 712 measures the current (step 904). At step 904, distance program 712 measures the current at both first ADC 650 and second ADC 652. In an embodiment, if the current is too small to measure, distance program 712 will increase the voltage in step 902.

Distance program 712 determines the distance (step 906). At step 906, distance program 712 uses the measured current to determine the distance. In other words, distance program 712 uses the measured current in first ADC 650 to determine the Y distance 644 between line 612 and via 652. Additionally, distance program 712 may use the measured current in second ADC 652 to determine the Y distance 646 between line 632 and via 642. In an embodiment, distance program 712 uses the information found in information repository 714 including, but not limited to, information about the dielectric properties of insulators between metals, information about known values for conductors in metal properties, and information about known values for insulators in between metal properties to determine the distance based on the current. A differential current recorded by ADC 650 and 652 can also be used to determine the delta in distance 644 and 646.

Figure 10:
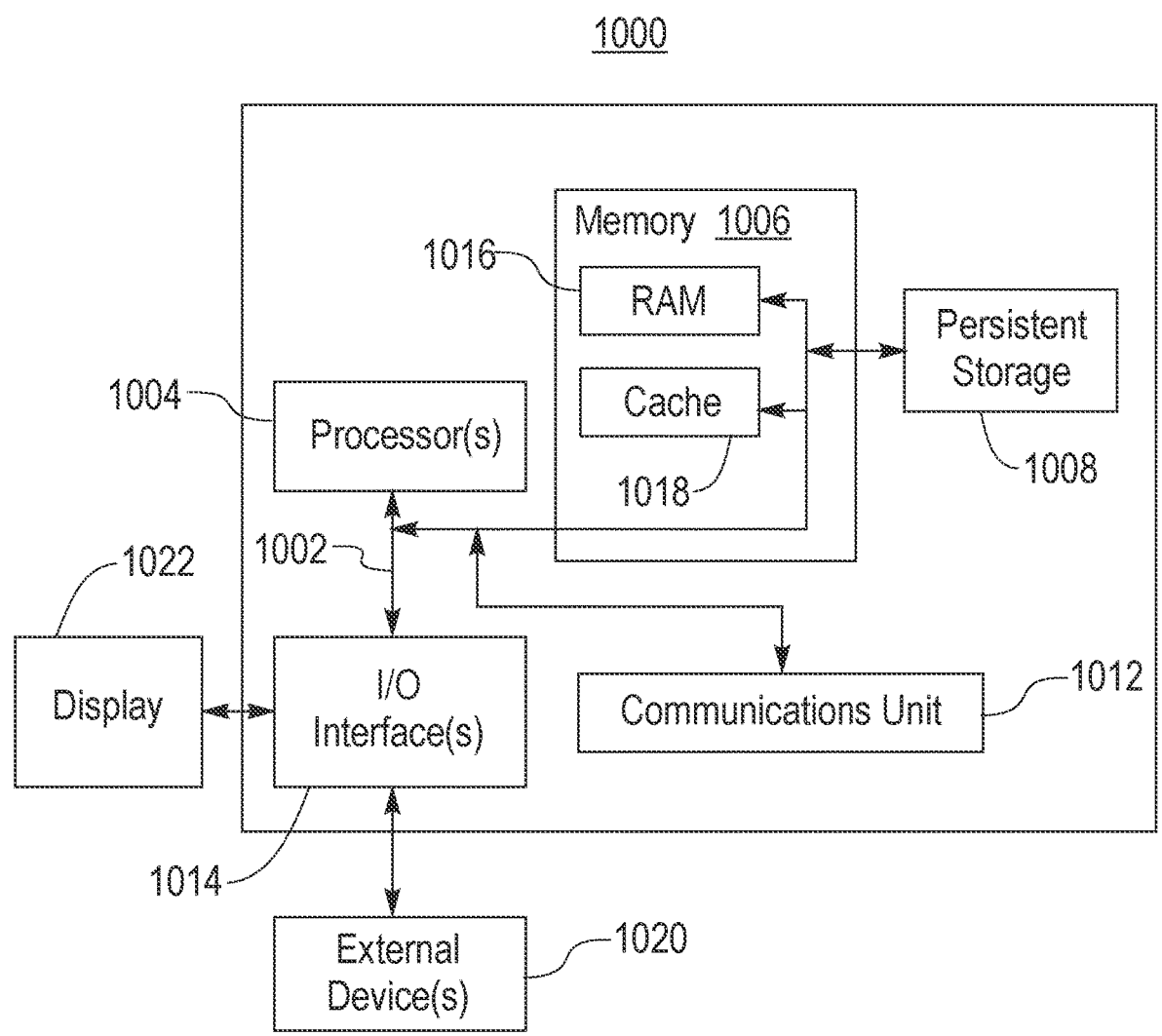
FIG. 10 is a block diagram depicting components of a computer, generally designated 1000, suitable for executing distance program 712, in accordance with at least one embodiment of the invention.

FIG. 10 is a block diagram depicting components of a computer 1000 suitable for distance program 712, in accordance with at least one embodiment of the invention. FIG. 10 displays the computer 1000, one or more processor(s) 1004 (including one or more computer processors), a communications fabric 1002, a memory 1006 including, a RAM 1016, and a cache 1018, a persistent storage 1008, a communications unit 1012, I/O interfaces 1014, a display 1022, and external devices 1020. It should be appreciated that FIG. 10 provides only an illustration of one embodiment and does not imply any limitations with regard to the environments in which different embodiments may be implemented. Many modifications to the depicted environment may be made.

As depicted, the computer 1000 operates over the communications fabric 1002, which provides communications between the computer processor(s) 1004, memory 1006, persistent storage 1008, communications unit 1012, and input/output (I/O) interface(s) 1014. The communications fabric 1002 may be implemented with an architecture suitable for passing data or control information between the processors 1004 (e.g., microprocessors, communications processors, and network processors), the memory 1006, the external devices 1020, and any other hardware components within a system. For example, the communications fabric 1002 may be implemented with one or more buses.

The memory 1006 and persistent storage 1008 are computer readable storage media. In the depicted embodiment, the memory 1006 comprises a random-access memory (RAM) 1016 and a cache 1018. In general, the memory 1006 may comprise any suitable volatile or non-volatile one or more computer readable storage media.

Program instructions distance program 712 may be stored in the persistent storage 1008, or more generally, any computer readable storage media, for execution by one or more of the respective computer processors 1004 via one or more memories of the memory 1006. The persistent storage 1008 may be a magnetic hard disk drive, a solid-state disk drive, a semiconductor storage device, read only memory (ROM), electronically erasable programmable read-only memory (EEPROM), flash memory, or any other computer readable storage media that is capable of storing program instruction or digital information.

The media used by the persistent storage 1008 may also be removable. For example, a removable hard drive may be used for persistent storage 1008. Other examples include optical and magnetic disks, thumb drives, and smart cards that are inserted into a drive for transfer onto another computer readable storage medium that is also part of the persistent storage 1008.

The communications unit 1012, in these examples, provides for communications with other data processing systems or devices. In these examples, the communications unit 1012 may comprise one or more network interface cards. The communications unit 1012 may provide communications through the use of either or both physical and wireless communications links. In the context of some embodiments of the present invention, the source of the various input data may be physically remote to the computer 1000 such that the input data may be received, and the output similarly transmitted via the communications unit 1012.

The I/O interface(s) 1014 allow for input and output of data with other devices that may operate in conjunction with the computer 1000. For example, the I/O interface 1014 may provide a connection to the external devices 1020, which may be as a keyboard, keypad, a touch screen, or other suitable input devices. External devices 1020 may also include portable computer readable storage media, for example thumb drives, portable optical or magnetic disks, and memory cards. Software and data used to practice embodiments of the present invention may be stored on such portable computer readable storage media and may be loaded onto the persistent storage 1008 via the I/O interface(s) 1014. The I/O interface(s) 1014 may similarly connect to a display 1022. The display 1022 provides a mechanism to display data to a user and may be, for example, a computer monitor.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disk read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, though the Internet using an Internet Service Provider). In some embodiments, electronic circuitry including, for example programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram blocks or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of computer program instructions, which comprises one or more executable instructions for implementing the specified logical function(s). In some alternative implementations, the functions noted in the block may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing form the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A wafer comprising:
    a first line in a first layer of the wafer, wherein the first line has a first terminal connected to the first line;
    a second line in the first layer of the wafer, wherein the second line has a second terminal connected to the second line, wherein the second terminal has a probe connected to apply a voltage ramp;
    a third line in the first layer of the wafer, wherein the third line has a third terminal connected to the third line;
    a first inverter connected to the first terminal, wherein the first inverter turn on when the voltage ramp is applied and the first line is closer to the second line than the second line is closer to the third line; and
    a second inverter connected to the third terminal, wherein the second inverter turn on when the voltage ramp is applied and the second line is closer to the third line than the first line is closer to the second line.

2. The wafer of claim 1, further comprising:
    a second metal layer, wherein the second metal layer includes one or more via located atop the second line in the first layer.

3. The wafer of claim 1, wherein the first line and the third line are part of a pattern of lines in a "X" direction.

4. The wafer of claim 1, wherein the first line and the third line are part of a pattern of lines in a "Y" direction.

5. The wafer of claim 3, wherein the second line is in the "X" direction.

6. The wafer of claim 3, wherein the second line is in a "Y" direction.

7. The wafer of claim 4, wherein the second line is in a "X" direction.

8. The wafer of claim 4, wherein the second line is in the "Y" direction.

9. The wafer of claim 1, wherein each terminal is made of a same material as a line it is connected to.

10. The wafer of claim 1, wherein one or more terminals are made of different materials as the line they are connected to.

11. The wafer of claim 1, further comprising:
    a first analog to digital converter connected to the first terminal; and
    a second analog to digital converter connected to the second terminal.

12. The wafer of claim 1, wherein an input to the first inverter and the second inverter are grounded through gates.

13. The wafer of claim 11, wherein an input of the first analog to digital converter and the second analog to digital converter are grounded through resistors.

14. A method, the method comprising:
    applying, by one or more computer processors, a voltage ramp to a second line in a wafer, wherein the second line is between a first line in the wafer and a third line in the wafer;
    determining, by one or more computer processors, whether a first inverter connected to the first line or a second inverter connected to the third line turns on; and
    responsive to determining either the first inverter or the second inverter turns on, determining, by one or more computer processors, if the first line is closer to the second line than the second line is to the third line based on which of the first inverter or the second inverter turns on.

* * * * *